United States Patent [19]
Morris

[11] Patent Number: 6,064,229
[45] Date of Patent: May 16, 2000

[54] VOLTAGE TRANSLATING BUFFER BASED ON LOW VOLTAGE TECHNOLOGY

[75] Inventor: Bernard Lee Morris, Emmaus, Pa.

[73] Assignee: Lucent Technologies Inc., Murray Hill, N.J.

[21] Appl. No.: 09/048,382

[22] Filed: Mar. 26, 1998

[51] Int. Cl.[7] .............................................. H03K 19/0185
[52] U.S. Cl. ................................ 326/81; 326/68; 326/86
[58] Field of Search ................................ 326/68, 80–81, 326/83, 86, 121, 57–58

[56] References Cited

U.S. PATENT DOCUMENTS

| | | | |
|---|---|---|---|
| 4,704,547 | 11/1987 | Kirsch . | |
| 5,300,832 | 4/1994 | Rogers | 326/57 |
| 5,440,249 | 8/1995 | Schucker et al. | 326/81 |
| 5,559,464 | 9/1996 | Orii et al. | 326/81 |
| 5,808,480 | 9/1998 | Morris | 326/81 |
| 5,834,948 | 11/1998 | Yoshizaki et al. | 326/81 |
| 5,892,371 | 4/1999 | Maley | 326/68 |

*Primary Examiner*—Jon Santamauro

[57] ABSTRACT

An integrated circuit, voltage translating buffer includes input, intermediate and output circuit stages. Each, circuit stage includes first and second n-FETS and a p-FET connected in series. The first n-FET of the input stage receives a first logic voltage within a low voltage range at its gate terminal. The output stage provides a translated output voltage within a higher voltage range at a circuit node between the second n-FET and the p-FET. Each of the second n-FETS of the three stages is operable to drop sufficient voltage across its conducting channel so as to prevent an excessive voltage drop across the conducting channel of the associated series connected first n-FET. Consequently, low voltage transistors may be used for the n-FETS, such that the buffer circuit can be manufactured with a reduced number of mask levels.

19 Claims, 4 Drawing Sheets

6,064,229

VOLTAGE TRANSLATING BUFFER BASED ON LOW VOLTAGE TECHNOLOGY

FIELD OF THE INVENTION

The present invention relates generally to buffer circuits, and more particularly, to a buffer circuit implemented with low voltage transistors, for translating logic signals from lower to higher voltage ranges.

BACKGROUND OF THE INVENTION

In various integrated circuit applications it is necessary for a logic circuit operating with relatively low logic levels to drive another logic circuit operating at higher logic levels. For certain complementary metal oxide semiconductor (CMOS) applications, for example, it is often necessary to translate 0–2.5 V logic signals generated by one logic circuit (i.e., 0 V for logic LOW and 2.5 V for logic HIGH) to 0–3.3 V logic signals to be supplied to another logic circuit operating at the higher levels. Accordingly, output buffer circuits have been developed to achieve such translation.

One prior art output buffer is shown in FIG. 1. Buffer circuit 10 operates to translate an input logic signal "All" at terminal 12, e.g., 0–2.5 V logic, to a logic signal "Z" at output terminal 14, e.g., 0–3.3 V logic. Transistors P1–P4 are p-channel field effect transistors, i.e. p-FETS (depicted with circles at their gates and outwardly pointing arrows), whereas devices N1–N4 are n-channel FETS (n-FETS). A supply voltage VDD1 of 3.3 V is applied to the drains of transistors P2–P4, and a supply voltage B. Morris 24 (90-D04) VDD2 of 2.5 V is applied to the drain of FET P1. Input logic signal A is applied to the gates of FETS N1 and N3. When the input A is zero volts (logic LOW) with respect to reference potential VSS, the output Z is also 0 V, whereas when voltage A is 2.5 V, the output Z is 3.3 V. Due to tolerance variation, the logic HIGH output signal Z may be as high as 3.6 V.

Transistors P1 and N1 form a standard inverter 18 to produce inverted voltage $A_n$ at node 15 which is the complement of voltage A. Transistors P2, P3, N2 and N3 form a cross-coupled pair. The sources of FETS N1, N2 and N3 are each tied to reference potential VSS (e.g., ground). When signal A is LOW, signal $A_N$ is HIGH, FET N2 is ON and FET N3 is OFF. This forces node 13 LOW, turning on FET P3, which pulls node 16 up to nearly VDD1. FET N4 is thus ON, while FET P4 is OFF, whereby the output signal Z is LOW. For this condition, transistor N3 has almost the full value of VDD1 (up to 3.6 V) across its drain-to-source terminals. Likewise, when input level A is HIGH (2.5 V), the output Z is nearly equal to VDD1 so that transistor N4 must tolerate a drain-to-source voltage (VDS) of up to 3.6 V. Transistor N2 must also tolerate this high $V_{DS}$ voltage for the latter condition.

In some CMOS technologies, the p-FET can tolerate a higher source-to-drain voltage than the n-FET can tolerate from drain-to-source. For instance, in one specific 0.25 μm (device length), 2.5 V technology, both the p-FET and the n-FET can typically tolerate up to 3.6 V across their gate oxides, the p-FET can tolerate a source-to-drain voltage of 3.6 V, but the n-FET can only tolerate up to 2.7 V from drain-to-source. To increase the drain-to-source voltage tolerance for the n-FETs, an additional mask level may be added which tailors the doping levels in the n-channel. Thus, in buffer 10 of FIG. 1, n-FETS N2–N4 are typically devices which have been fabricated using such an additional mask level since they are required to tolerate a $V_{DS}$ voltage of up to 3.6 V as discussed above. The additional processing step for this mask level, however, increases the fabrication cost and throughput time for the wafers.

SUMMARY OF THE INVENTION

In an illustrative embodiment of the present invention, there is provided an integrated circuit buffer having input, intermediate and output circuit stages. Each circuit stage includes first and second n-FETS and a p-FET connected in series. The first n-FET of the input stage receives a first logic voltage within a low voltage range at its gate terminal. The output stage provides a translated output voltage within a higher voltage range at a circuit node between the second n-FET and the p-FET. Each of the second n-FETS of the three stages is operable to drop sufficient voltage across its conducting channel so as to prevent an excessive voltage drop across the conducting channel of the associated series-connected first n-FET.

Advantageously, since the second n-FET of each stage prevents an excessive voltage drop across the conducting channel (between drain and source terminals) of the series-connected first n-FET, low voltage devices can be employed for all the n-FETS. Consequently, an additional mask level otherwise necessary to produce high-voltage tolerant n-FETS can be avoided, whereby the fabrication process for the overall buffer circuit is facilitated.

The buffer circuit may be implemented in non-inverting or inverting configurations. In a tri-state buffer embodiment, two buffer circuits are utilized in conjunction with input logic gates and an output circuit leg including a pair of low-voltage technology-based n-FETS and a p-FET connected in series.

BRIEF DESCRIPTION OF THE DRAWINGS

The following detailed description, given by way of example and not intended to limit the present invention solely thereto, will best be appreciated in conjunction with the accompanying drawings, in which like reference numerals denote like parts or elements, wherein.

DETAILED DESCRIPTION OF CERTAIN PREFERRED EMBODIMENTS

Figure 2:
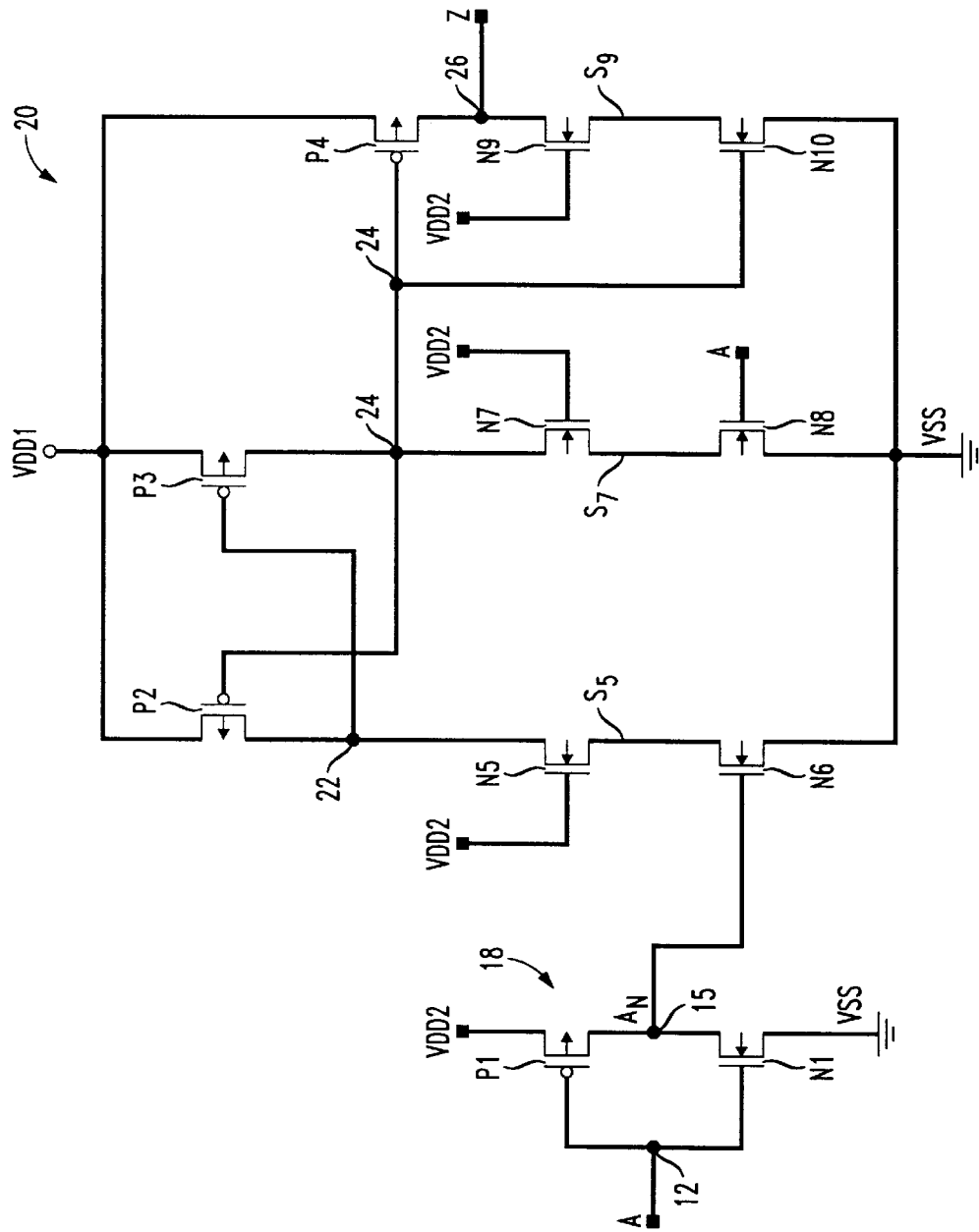
FIG. 2 is a schematic diagram of a voltage translating buffer circuit in accordance with the present invention.

With reference now to FIG. 2, an exemplary embodiment of the present invention, integrated circuit (IC) buffer 20, is schematically illustrated. Buffer circuit 20 operates to translate relatively lower input logic levels to higher logic levels without the need for high $V_{DS}$ voltage tolerant n-FETS. As such, buffer circuit 20 can be fabricated with a simpler manufacturing process than for prior art buffers of similar type.

Figure 1:
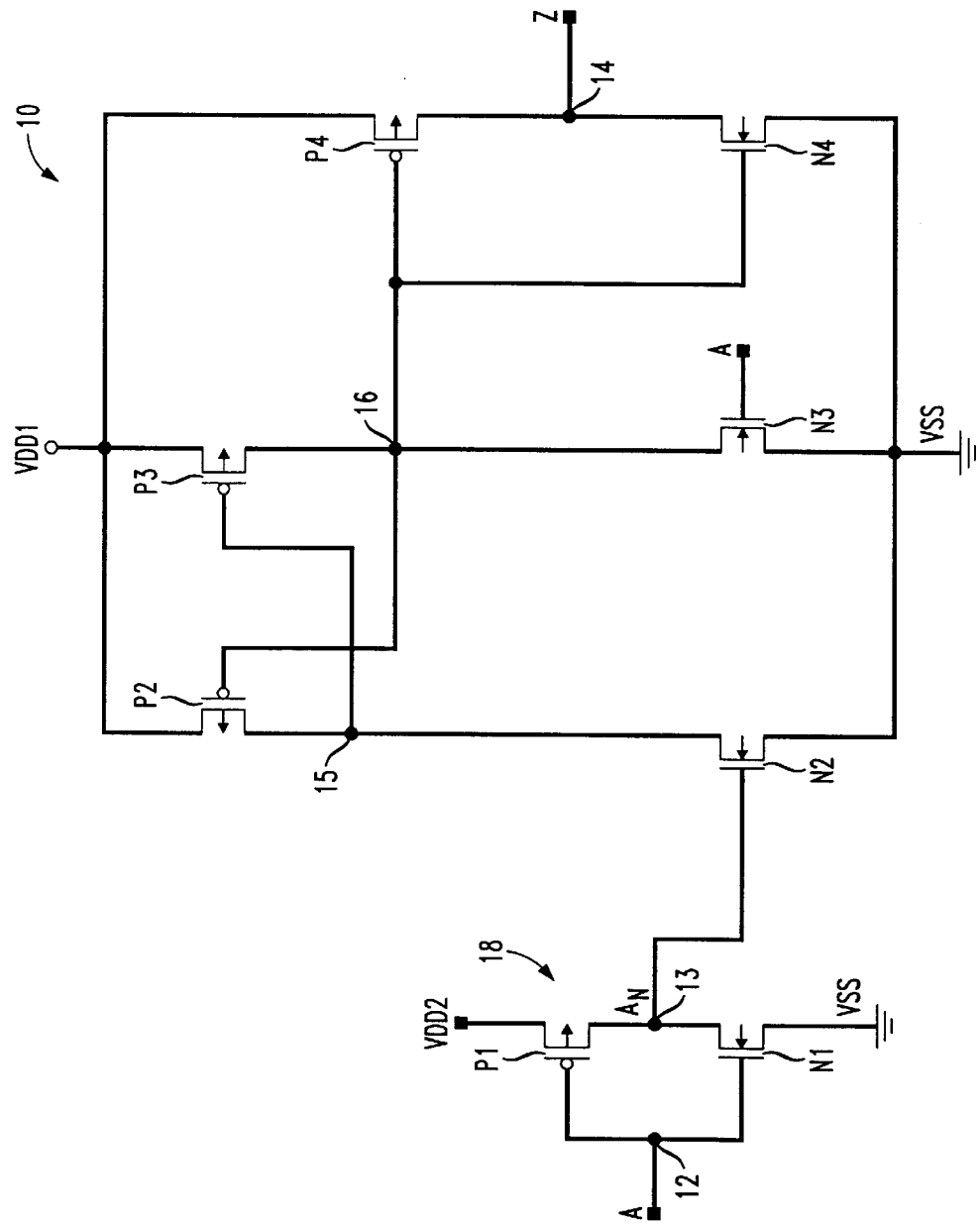
FIG. 1 is schematic diagram of a prior art buffer circuit.

Buffer circuit 20 differs from buffer circuit 10 of FIG. 1 in two respects. First, buffer 20 employs three additional n-FETS, N5, N7 and N9, each of which has its gate tied to the lower supply voltage VDD2 and each of which acts as a source follower. Second, because n-FETS N5, N7 and N9 function to protect n-FETS N6, N8 and N10, respectively, the latter are not required to be high $V_{DS}$ tolerant devices. FETS N5, N7 and N9 likewise need not be high voltage tolerant. Briefly, a logic HIGH level at output terminal 26, e.g., 3.6 V, does not appear across the drain-to-source terminals of a single n-FET. Rather, that voltage is shared across the drain-to-source terminals of two n-FETS, N9 and N10, in a manner such that neither n-FET experiences a $V_{DS}$ voltage drop of more than a predetermined lower voltage, e.g., about 2 V. Similarly, the higher supply voltage VDD1 is shared across the drain-to-source paths of both FETS N7 and N8, and also across the drain-to-source paths of FETS N5 and N6. Consequently, none of the n-FETS of buffer 20 need be high $V_{DS}$ tolerant devices. That is, n-FETS N1 and N5–N10 are preferably fabricated in low voltage technology (corresponding to the lower input logic levels to be translated).

For purposes of explication, it will be assumed in the following discussion that buffer 20 translates logic signal A at terminal 12 in the range of 0–2.5 V to logic signal Z at output terminal 26 in the range of 0–3.3 V. For this case, all transistors N1, N5–N10 and P1–P4 are preferably manufactured in 2.5 V integrated circuit technology. It is understood, however, that buffer circuit 20 can be employed to translate other logic levels—e.g., 0–3.3 V input logic can be translated to 0–5 V output logic, etc. The invention is not limited to any particular logic level translation.

Detailed operation of buffer circuit 20 is as follows. Supply voltage VDD1 of 3.3 V is applied to the source terminals of p-FETS P2–P4. Supply voltage VDD2 of 2.5 V is applied to the source of p-FET P1 as well as to the gates of n-FETS N5, N7 and N9. Transistors P2, N5 and N6 form an input stage of buffer 20; transistors P3, N7 and N8 form an intermediate stage; and transistors P4, N9 and N10 form an output stage. All transistors of buffer circuit 20, as well as those of the other embodiments disclosed herein, are field effect transistors, such as metal-oxide semiconductor FETS (MOSFETS) based in silicon, GaAs or other III–V metals, or other FET types.

Input logic A is applied to terminal 12 and inverted by inverter 18 to generate complementary logic $A_N$ at node 15 as in the aforedescribed prior art circuit. When signal A is logic LOW, signal $A_N$ is logic HIGH, and transistor N6 conducts since its source is tied to the low reference potential VSS. Also, transistor N8 is OFF because the logic LOW input signal A is applied to its gate terminal. With transistor N6 conducting, the source terminal $S_5$ of transistor N5 is pulled low. Transistor N5 is thus turned on, since supply voltage VDD2 is present at its gate. As such, the drain-to-source voltage drops across each of transistors N5 and N6 is very small, e.g., 0.05–0.1 V, thereby, forcing circuit node 22 low. The gate of transistor P3 is connected to circuit node 22, so that transistor P3 conducts, thereby pulling up the potential at circuit node 24 to nearly VDD1. (The p-FETS conduct with low voltages applied across their gate-to-source terminals whereas the n-FETS conduct with high voltages applied form gate to source). Transistor P2, which has its drain tied to circuit node 22, is therefore in a non-conducting state, whereby the full potential of VDD1 is dropped across its source-to-drain terminals.

With circuit node 24 pulled to nearly VDD1, the potential at the source $S_7$ of transistor N7 will approximately equal (VDD2–$V_{TN}$), where $V_{TN}$ is the threshold voltage of transistor N7, e.g., about 1 V. Thus, the potential at source $S_7$ is about 1.5 V. Transistor N7 will now have a drain-to-source voltage drop of about VDD1–(VDD2–$V_{TN}$), or (VDD1–1.5 V), which is approximately 1.8 V in this example. With source $S_7$ at about 1.5 V, the voltage across the drain-to-source terminals of transistor N8 is also about 1.5 V in the nominal case. Accordingly, when considering tolerance variation of about ±10%), the drain-to-source voltage across transistor N8 never exceeds about 1.65 V, and the drain-to-source voltage across transistor N7 never exceeds about 2.0 V, assuming a maximum supply voltage VDD1 of 3.6 V. Thus, transistors N7 and N8 need not be designed as high $V_{DS}$ voltage tolerant devices.

With continuing reference to the logic LOW input condition, since the gate of FET N10 is connected to circuit node 24 and node 24 is pulled to nearly VDD1, FET N10 is turned ON. The source $S_9$ of transistor N9 is consequently pulled LOW, turning this transistor on as well, and pulling output terminal 26 down to nearly VSS, whereby the output Z is a logic LOW. The relatively high voltage at circuit node 24, in conjunction with the conduction of transistors N9 and N10 to pull down circuit node 26, results in transistor P4 being turned off (since its gate is tied to node 24). As a result, the full VDD1 voltage is dropped across the source-to-drain terminals of transistor P4. Since the p-FET devices tolerate higher absolute drain-to-source voltages than the n-FETs, no special measures are necessary to provide further protection for the p-FETS. As mentioned above, in one specific 0.25 μm technology, for example, p-FETS are readily manufactured to tolerate 3.6 V from source-to-drain. Hence, the same p-FETS as used in prior art buffers, e.g., in the buffer of FIG. 1, may be employed for the p-FETS of buffer circuit 20.

For the logic HIGH input condition, i.e., with signal A at about 2.5 V, the inverted signal $A_N$ is LOW, turning transistor N6 off. Transistor N8, on the other hand, is turned on since 2.5 V is present on its gate. With transistor N8 conducting, the source of transistor N7 is pulled down to nearly VSS, pulling circuit node 24 LOW. Transistor P2 conducts since its gate is connected to node 24, whereby the voltage at circuit node 22 is almost VDD1. In an analogous manner described above for transistors N7 and N8 for the logic LOW input condition (i.e., when node 24 is HIGH), the VDD1(=3.3 V) voltage at circuit node 22 is dropped across the conducting channels of both transistors 145 and N6, with about 1.8 V being dropped across the drain-to-source of transistor N5 and about 1.5 V being dropped across the drain-to-source of transistor N6. Hence, transistors N5 and N6 likewise need not be high $V_{DS}$ voltage tolerant devices.

With circuit node 24 pulled LOW for the logic HIGH input condition, transistor P4 conducts, whereby the output circuit node 26 is pulled HIGH to VDD1=3.3 V. Thus, the logic HIGH input A of 2.5 V is successfully translated to the higher logic HIGH output Z of 3.3 V. The 3.3 V at circuit node 26 is dropped across the conducting channels of both transistors N9 and N10 in an analogous manner as described above for FETS N7 and N8 for the logic LOW input condition. That is, about 1.8 V is dropped across the drain-to-source of FET N9 and 1.5 V is dropped across the drain-to-source of FET N10. Accordingly, for the logic HIGH input condition, transistor N9 protects transistor N10, and transistor N5 protects transistor N6.

Figure 3:
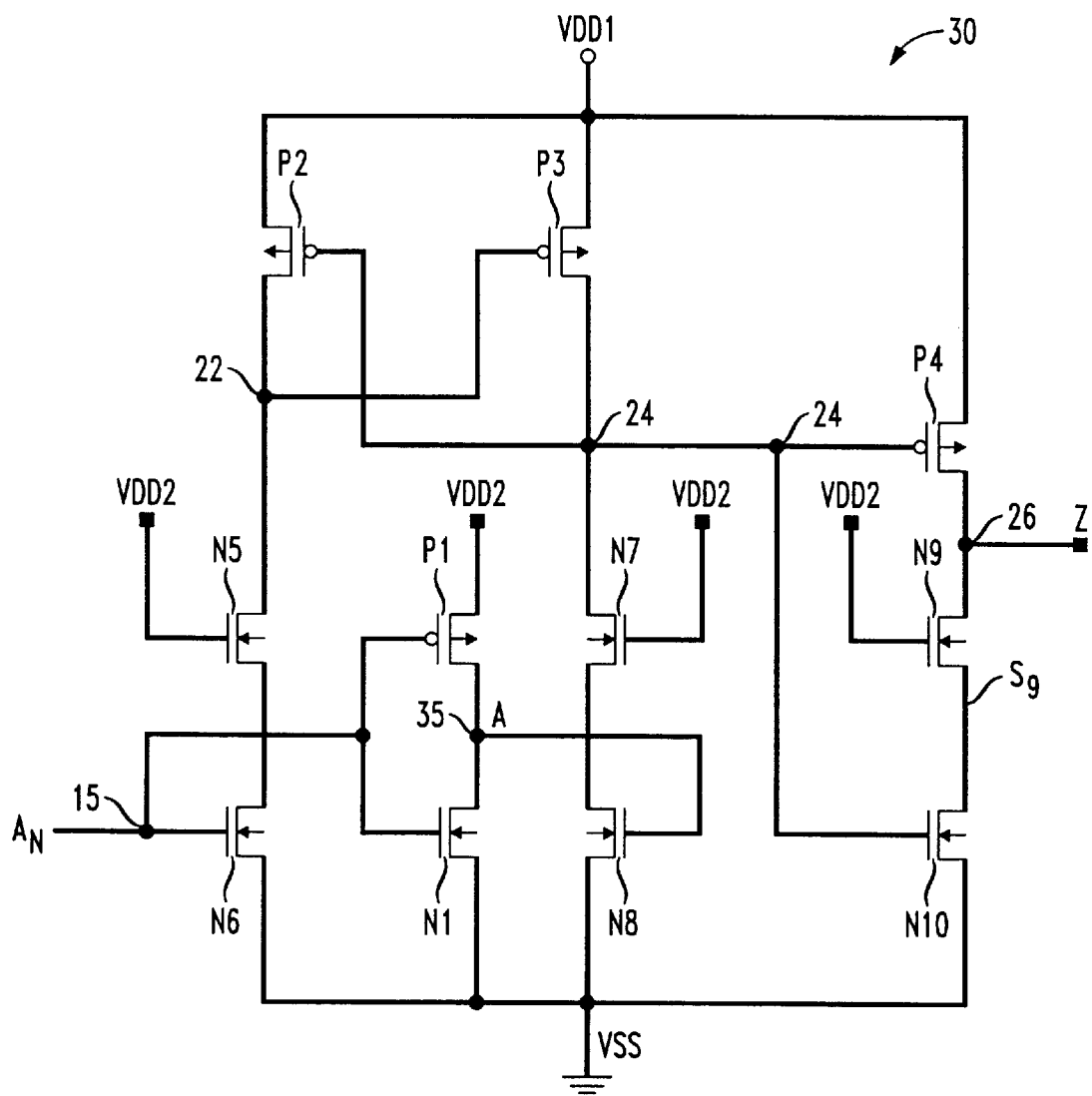
FIG. 3 schematically illustrates an embodiment of an inverting buffer circuit in accordance with the invention.

Turning now to FIG. 3, an inverting, voltage translating IC buffer 30 in accordance with the invention is illustrated. Buffer circuit 30 is essentially the same as buffer circuit 20 of FIG. 2, except that the circuit connection of inverter 18 has changed. The input logic in this embodiment is the signal $A_N$ applied to input terminal 15. Input signal $A_N$ is applied to the gate of transistor N6 as well as to the gates of transistors P1 and N1 of inverter 18. The complementary voltage A is provided at circuit node 35 which connects to the source of FET P1, the drain of FET N1 and the gate of FET N8. Aside from this modified circuit connection of inverter 18, the operation of buffer circuit 30 is the same as for buffer circuit 20, with the input logic being $A_N$ rather than A. Accordingly, when the input $A_N$ is LOW, the output signal Z at terminal 26 is at the translated high voltage, e.g., 3.3 V, and when input $A_N$ is HIGH (e.g., 2.5 V), the output Z is 0 V.

Figure 4:
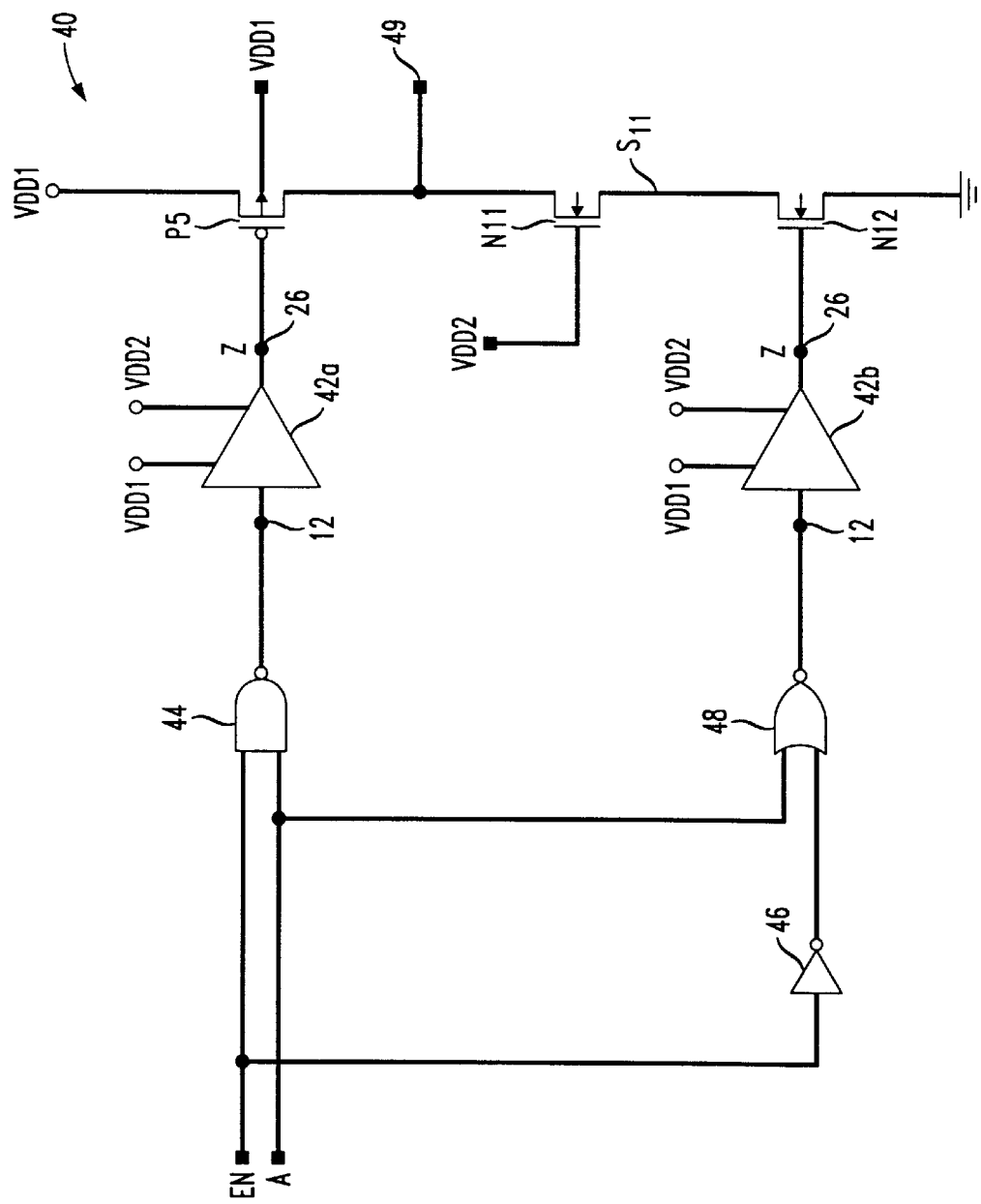
FIG. 4 schematically illustrates a tri-state buffer embodiment of the present invention.

Referring now to FIG. 4, an embodiment of a tri-states integrated circuit buffer in accordance with the invention is schematically illustrated, designated as 40. Buffer circuit 40 utilizes two voltage translating buffers, 42a and 42b, each of which may have an identical topology to buffer circuit 20 of FIG. 2. For this case, tri-state buffer 40 is non-inverting. In the alternative, buffers 42a and 42b can each have the identical topology as buffer circuit 30 of FIG. 3, in which case buffer 40 is configured as an inverting type tri-state buffer. In either case, buffer 42a may employ the same or different size transistors as buffer 42b.

In operation of the non-inverting embodiment of buffer circuit 40, input logic signal A of, e.g., 0–2.5 V as in the circuits described above, is applied to one input terminal of NAND gate 44. Logic signal A is also applied to one input terminal of NOR gate 48. An enable input signal EN is applied to the other input terminal of NAND gate 44, as well as to the input terminal of inverter 46. The inverted output thereof is supplied to the second input terminal of NOR gate 48. When signal A is LOW and EN is HIGH (e.g., 2.5 V), the output of NAND gate 44 is HIGH and the output of NOR gate 48 is HIGH. As such, the outputs of buffer circuits 42a and 42b will both be the high, translated logic level, e.g., 3.3 V, thereby turning transistor N12 ON while turning transistor P5 OFF. With transistor N12 conducting, the source $S_{11}$ of transistor N11 is pulled LOW, such that transistor N11 is turned on, and the output voltage at output terminal 49 is LOW (0 V), whereby the logic LOW input is successfully translated. If the enable voltage EN is brought LOW, the output of NAND gate 44 is remains HIGH and transistor P5 remains OFF. However, the output of NOR gate 48 falls LOW, causing the output of buffer 42b to fall LOW and transistor N12 to turn off. Thus, terminal 49 will be in a high impedance state, which is the desired result, for tri-state logic when signal EN is LOW.

When the input A and the enable signal EN are both HIGH (2.5 V), the outputs of NAND gate 44 and NOR gate 48 both fall to the logic LOW level. Then, the outputs of buffers 42a and 42b are LOW, transistor P5 is ON and transistors N12 and N11 are both OFF. The output logic at terminal 49 is thereby pulled HIGH to almost the supply voltage VDD1, e.g., 3.3 V. This voltage is dropped across the conducting channels of both transistors N11 and N12, with about a 1.8 V drop across the drain-to-source of FET N11 and about 1.5 V across the drain-to-source of FET 12. Hence, since the $V_{DS}$ drop across either one of these n-FETS never exceeds about 2 V, both devices can be fabricated in 2.5 V technology. When signal EN is LOW and signal A is HIGH, the gates of devices P5 and N12 are both LOW as in the previous case, turning those devices off such that terminal 49 is in the high impedance state as desired.

Buffer circuit 40 can be configured as an inverting buffer by embodying each of buffer circuits 42a and 42b as the inverting buffer circuit 30 of FIG. 3. In this case, when the input A is LOW and signal EN is HIGH, the outputs of buffers 42a and 42b are both HIGH, transistors P5 and N12 are both OFF, and the output at terminal 49 is HIGH (3.3 V). When signal A is HIGH (2.5 V) and signal EN is HIGH, the output logic is LOW since transistors N11 and N12 both conduct. As such, the input logic A is successfully translated to the higher logic range.

While the present invention has been described above with reference to specific embodiments thereof, it is under-stood that one skilled in the art may make many modifications to the disclosed embodiments without departing from the scope of the invention. For instance, the supply voltage VDD2 applied to the gates of FETS N5, N7 and N9 in FIGS. 2 and 3 need not be the same as the logic HIGH voltage of the lower voltage range. (For example, for the input logic range of 0–2.5 V, VDD2 may be different than 2.5 V.) Further, it is possible to employ more than two n-FETS in each of the three stages (legs) of the buffer circuits of FIGS. 2 or 3 in order to share the higher logic voltage across three or more n-FETS instead of across two n-FETS. Accordingly, these and other modifications are intended to be included within the scope and spirit of the invention as defined by the appended claims.

What is claimed is:

1. An integrated circuit including a voltage translating buffer circuit, characterized in that said buffer circuit comprises:

input, intermediate and output circuit stages, each circuit stage including first and second n-channel field effect transistors (n-FETS) connected in series;

wherein, said first n-FET of said input stage having a gate terminal connected to receive a first logic voltage within a first logic voltage range;

said first n-FET of said output stage having a gate terminal directly connected to a p-channel field effect transistor (p-FET) of said input stage;

said output stage providing an output logic voltage at a circuit node between said second n-FET and a p-FET connected in series therewith, said output voltage being translated with respect to said first logic voltage to a second logic voltage range higher than said first range; and each of said second n-FETS operable to drop sufficient voltage across a conducting channel thereof so as to prevent an excessive voltage drop across a conducting channel of the associated first n-FET in series therewith.

2. The integrated circuit of claim 1 wherein each of said input and intermediate stages further includes a p-FET connected in series with the first and second n-FETS thereof.

3. The integrated circuit of claim 1 wherein said first n-FET of said intermediate stage is connected to receive, at a gate terminal thereof, a second logic voltage of said first logic range and complementary to said first logic voltage.

4. The integrated circuit of claim 2 wherein each of said p-FETS have a first conducting terminal coupled to receive a supply voltage higher than a maximum voltage of said first logic range, and a second conducting terminal coupled to an associated second n-FET.

5. The integrated circuit of claim 1 wherein said first logic voltage is an input signal to said buffer circuit, and said buffer circuit further comprising an inverter coupled between said gate terminal of the first n-FET of said first stage and a gate terminal of the first n-FET of said intermediate stage, whereby said buffer circuit operates as an inverting buffer.

6. The integrated circuit of claim 1, further comprising an inverter having an input terminal connected to receive an input logic signal to said buffer circuit and an output terminal coupled to said gate terminal of said first n-FET of said first stage, said first logic signal thereby being complementary to said input logic signal and said buffer circuit operating as a non-inverting buffer.

7. The integrated circuit of claim 1 wherein all of said first and second n-FETS of said input, intermediate and output stages are low voltage type devices capable of withstanding only limited conduction channel voltage drops associated with operation within said first voltage range.

8. An integrated circuit including a voltage translating buffer circuit, characterized in that said buffer circuit comprises:

input, intermediate and output circuit stages, each circuit stage including first and second n-channel field effect transistors (n-FETS) and a p-channel field effect transistor (p-FET) connected in series, each of said first n-FETS having a source terminal connected to a point of low reference potential;

wherein,
said first n-FET of said input stage has a gate terminal connected to receive a first logic voltage within a first logic voltage range, and said first n-FET of said intermediate stage is connected to receive, at a gate terminal thereof, a second logic voltage complementary to said first logic voltage and within said first logic range;

each of said p-FETS has a source terminal coupled to receive a first supply voltage higher than a maximum voltage of said first range, and a drain terminal coupled to a drain terminal of an associated second n-FET, with a gate terminal of the intermediate stage p-FET coupled to the drain terminal of the input stage p-FET, and with the drain terminal of the intermediate stage p-FET directly coupled to each of: a gate terminal of the input stage p-FET, a gate terminal of the output stage p-FET, and a gate terminal of the first output stage n-FET;

each of said second n-FETS receiving a second supply voltage at a gate terminal thereof lower than said first supply voltage, and each second n-FET operable to drop sufficient voltage across drain-to-source terminals thereof so as to prevent an excessive voltage drop across drain-to-source terminals of the associated first n-FET in series therewith; and said output stage providing an output logic voltage at a circuit node between the drain terminal of said second n-FET and the drain terminal of said p-FET thereof, said output voltage being translated with respect to said first logic voltage to a second logic range higher than said first range.

9. The integrated circuit of claim 8 wherein said first logic voltage is an input signal to said buffer circuit, and said buffer circuit further comprising an inverter coupled between said gate terminal of the first n-FET of said first stage and a gate terminal of the first n-FET of said intermediate stage, whereby said buffer circuit operates as an inverting buffer.

10. The integrated circuit of claim 8, further comprising an inverter having an input terminal connected to receive an input logic signal to said buffer circuit and an output terminal coupled to said gate terminal of said first n-FET of said first stage, said first logic signal thereby being complementary to said input logic signal and said buffer circuit operating as a non-inverting buffer.

11. The integrated circuit of claim 8 wherein all of said first and second n-FETS of said input, intermediate and output stages are low voltage type devices capable of withstanding only limited drain-to-source voltage drops associated with operation within said first logic range.

12. The integrated circuit of claim 8 wherein said second supply voltage corresponds to a maximum voltage of said first logic range.

13. The integrated circuit of claim 8 wherein said first supply voltage corresponds to a maximum voltage of said second logic range.

14. An integrated circuit including a tri-state, voltage translating buffer circuit, characterized in that said buffer circuit comprises:

a logic circuit operative to receive both a logic signal input and an enable signal within a first logic range and to generate therefrom first and second logic HIGH signals within said first range at first and second circuit nodes, respectively, when said logic signal input is logic LOW and said enable signal is HIGH, and to generate logic LOW signals at said first and second circuit nodes when both said logic signal input and said enable signal are logic HIGH;

a first buffer having an input terminal coupled to said first circuit node and a second buffer having an input terminal coupled to said second circuit node;

each of said first and second buffers comprising:
input, intermediate and output circuit stages, each circuit stage including first and second n-channel field effect transistors (n-FETS) connected in series;

wherein,
said first n-FET of said input stage having a gate terminal connected to receive a first logic voltage within said first logic range;

said first n-FET of said output stage having a gate terminal directly connected to a p-channel field effect transistor (p-FET) of said input stage;

said output stage providing an output logic voltage at a circuit node between said second n-FET and a p-FET connected in series therewith, said output voltage being translated with respect to said first logic voltage to a second logic range higher than said first range; and each of said second n-FETS operable to drop sufficient voltage across a conducting channel thereof so as to prevent an excessive voltage drop across a conducting channel of the associated first n-FET in series therewith; and said tri-state buffer circuit further including an output circuit part including: an output p-FET having a gate terminal connected to receive said output logic voltage of said first buffer and a source terminal connected to receive a supply voltage higher than a maximum voltage of said first logic range; first and second output n-FETS connected in series, with said first output n-FET having a gate terminal connected to receive said output logic voltage of said second buffer and a source terminal connected to a point of low reference potential, and said second output n-FET operable to drop sufficient voltage across drain-to-source terminals thereof so as to prevent an excessive voltage drop across drain-to-source terminals of said first output n-FET; said output circuit part thereby providing a translated output voltage with respect to said logic signal input at a circuit node in between said second output n-FET and said output p-FET, said translated output voltage being within said second logic range.

15. The integrated circuit of claim 14 wherein all of said first and second n-FETS of said input, intermediate and output stages and said first and second output n-FETS are low voltage type devices capable of withstanding only limited drain-to-source voltage drops associated with operation within said first logic range.

16. The integrated circuit of claim 14 wherein said logic circuit comprises:

a NAND gate connected to receive said enable signal and said input logic signal at respective first and second input terminals thereof, and having an output terminal coupled to said input terminal of said first buffer;

an inverter having an input terminal at which said enable signal is applied; and, a NOR gate having a first input terminal coupled to an output terminal of said inverter, a second input terminal connected to receive said input logic signal, and an output terminal coupled to said input terminal of said second buffer.

17. The integrated circuit of claim 14 wherein each of said first and second buffers are non-inverting buffers, whereby said tri-state buffer circuit is a non-inverting circuit.

18. The integrated circuit of claim 14 wherein each of said first and second buffers are inverting buffers, whereby said tri-state buffer circuit is an inverting circuit.

19. The integrated circuit of claim 14 wherein, for each said buffer:

each of said input and intermediate stages further include a p-FET connected in series with the first and second n-FETS thereof;

said first n-FET of said intermediate stage is connected to receive, at a gate terminal thereof, a second logic voltage in said first range and complementary to said first logic voltage; and each of said p-FETS has a first conducting terminal coupled to receive a supply voltage higher than a maximum voltage of said first range, and a second conducting terminal coupled to an associated second n-FET.

* * * * *